United States Patent
Koitzsch et al.

(10) Patent No.: US 10,654,133 B2
(45) Date of Patent: May 19, 2020

(54) METHOD AND DEVICE FOR SEPARATING A FLAT WORKPIECE INTO A PLURALITY OF SECTIONS

(71) Applicant: 3D-Micromac AG, Chemnitz (DE)

(72) Inventors: Matthias Koitzsch, Erlangen (DE); Dirk Lewke, Erlangen (DE); Alexander Tobisch, Erlangen (DE); Hans-Ulrich Zühlke, Jena (DE); Frank Allenstein, Chemnitz (DE)

(73) Assignee: 3D-Micromac AG, Chemnitz (DE)

( * ) Notice: Subject to any disclaimer, the term of this patent is extended or adjusted under 35 U.S.C. 154(b) by 385 days.

(21) Appl. No.: 14/907,006

(22) PCT Filed: Jul. 1, 2014

(86) PCT No.: PCT/EP2014/063972
§ 371 (c)(1),
(2) Date: Jan. 22, 2016

(87) PCT Pub. No.: WO2015/010862
PCT Pub. Date: Jan. 29, 2015

(65) Prior Publication Data
US 2016/0158880 A1   Jun. 9, 2016

(30) Foreign Application Priority Data

Jul. 23, 2013   (WO) ................. PCT/EP2013/002191

(51) Int. Cl.
*B23K 26/53*    (2014.01)
*B23K 26/046*   (2014.01)
(Continued)

(52) U.S. Cl.
CPC .......... *B23K 26/53* (2015.10); *B23K 26/0006* (2013.01); *B23K 26/046* (2013.01);
(Continued)

(58) Field of Classification Search
CPC ................................. B23K 26/0054; B23K 26/0057; B23K 26/53; B23K 26/359; B23K 26/364;
(Continued)

(56) References Cited

U.S. PATENT DOCUMENTS 6,259,058 B1 *  7/2001  Hoekstra ............ B23K 26/0057
                                                   219/121.67
6,744,009 B1    6/2004  Xuan et al.
(Continued)

FOREIGN PATENT DOCUMENTS

DE    102 30 456 A1    8/2003
EP    1 716 960 B1     3/2010
(Continued)

OTHER PUBLICATIONS

Notice of Reasons for Rejection dated Dec. 12, 2017, of corresponding Japanese Application No. 2016-528389, along with an English translation.

*Primary Examiner* — Tu B Hoang
*Assistant Examiner* — Erin E McGrath
(74) *Attorney, Agent, or Firm* — DLA Piper LLP (US)

(57) ABSTRACT

A method of separating a workpiece into a plurality of sections includes generating one or a plurality of lines of modified material along one or a plurality of predefined separating lines in the workpiece in a first step by local material processing using a laser beam through a surface of the workpiece, which results in a reduction of breaking stress of the workpiece along the separating lines, and dividing, in a second step, the workpiece into the sections along the separating lines by thermal laser beam separation, wherein the one or the plurality of lines are generated completely or at least in portions at a distance from the surface in the workpiece.

20 Claims, 5 Drawing Sheets

(51) Int. Cl.
*C03B 33/02* (2006.01)
*B23K 26/00* (2014.01)
*B23K 26/146* (2014.01)
*C03B 33/09* (2006.01)
*B23K 26/40* (2014.01)
*B23K 26/60* (2014.01)
*H01L 21/78* (2006.01)
*B23K 103/00* (2006.01)

(52) U.S. Cl.
CPC ............ *B23K 26/146* (2015.10); *B23K 26/40* (2013.01); *B23K 26/60* (2015.10); *C03B 33/0222* (2013.01); *C03B 33/091* (2013.01); *C03B 33/093* (2013.01); *H01L 21/78* (2013.01); *B23K 2103/50* (2018.08); *B23K 2103/52* (2018.08); *B23K 2103/54* (2018.08); *B23K 2103/56* (2018.08); *Y02P 40/57* (2015.11)

(58) Field of Classification Search
CPC ........ B23K 26/38; B23K 26/40; B23K 26/50; B23K 26/55; B23K 26/57; C03B 33/0222; C03B 33/093
USPC ............ 219/121.72, 121.76, 121.67, 68, 69; 483/463; 264/400
See application file for complete search history.

(56) References Cited

U.S. PATENT DOCUMENTS

| 8,624,153 | B2 | 1/2014 | Atsumi et al. | |
|---|---|---|---|---|
| 2003/0019848 | A1* | 1/2003 | Nicholas | B23K 26/03 219/121.7 |
| 2004/0002199 | A1* | 1/2004 | Fukuyo | B23K 26/0057 438/460 |
| 2007/0170162 | A1* | 7/2007 | Haupt | B23K 26/064 219/121.72 |
| 2008/0217311 | A1 | 9/2008 | Eberhardt et al. | |
| 2008/0218735 | A1 | 9/2008 | Atsumi et al. | |
| 2010/0025387 | A1* | 2/2010 | Arai | B28D 5/00 219/121.69 |
| 2010/0068632 | A1 | 3/2010 | Ono et al. | |
| 2012/0211477 | A1* | 8/2012 | Chacin | B23K 26/0853 219/121.69 |
| 2013/0068736 | A1 | 3/2013 | Mielke et al. | |
| 2014/0097163 | A1 | 4/2014 | Atsumi et al. | |

FOREIGN PATENT DOCUMENTS

| EP | 1 924 392 B1 | 9/2010 |
|---|---|---|
| JP | 2003-034545 | 2/2003 |
| JP | 2006-007619 A | 1/2006 |
| JP | 2006-035710 | 2/2006 |
| JP | 2006-131443 A | 5/2006 |
| JP | 2007-014975 | 1/2007 |
| JP | 2007-021514 | 2/2007 |
| JP | 2009-023215 | 2/2009 |
| JP | 2012-28734 A | 2/2012 |
| JP | 2012-076093 | 4/2012 |

* cited by examiner

METHOD AND DEVICE FOR SEPARATING A FLAT WORKPIECE INTO A PLURALITY OF SECTIONS

TECHNICAL FIELD

This disclosure relates to a method of separating a flat workpiece into a plurality of sections, wherein, in a first step by local material processing using a laser beam through a surface of the workpiece, one or a plurality of lines of modified material are generated along one or a plurality of predefined separating lines in the workpiece, which result in a reduction of the breaking stress of the workpiece along the separating lines, and, in a second step, the workpiece is divided into the sections along the separating lines by thermal laser beam separation. The disclosure also relates to a device designed to carry out the method.

BACKGROUND

In many technical areas it is necessary to divide a larger workpiece into a plurality of generally identical shaped sections or to separate a plurality of uniform structures from a workpiece. One example is singulation of components or chips in the semiconductor industry or related industries such as, e.g., MEMS, solar or optics. In that case, a multiplicity of components are produced on a common substrate. Once the components have been completely processed, they have to be separated from one another so that they can be further individually processed.

Various requirements are made of the singulation process, e.g., high throughput, high quality and sufficiently accurate geometrical course of the resulting component edges, clean separation of layer stacks of different materials, no losses in quality of the components and low costs per singulation step. The method and the device can also be used in the same way in other technical fields, e.g., in the glass and ceramic industry.

The problem when separating a flat workpiece into a plurality of sections is explained below on the basis of application in the semiconductor industry, where various methods and devices exist for the singulation process. The components produced on substrates are usually separated with the aid of mechanical or laser-based technologies.

In addition, there are technologies combined from mechanical and laser-based methods and also plasma etching methods and separating methods by thinning by grinding.

The last two methods mentioned and the combined methods are only of secondary importance.

Independently of the separating technology chosen, in general before the separating process, the substrate to be separated is fixed on a carrier so that the substrate does not slip during processing, the components can be separated in a controlled manner and components that have already been separated are not lost. The type of fixing is chosen depending on the substrate to be processed. In microelectronics, e.g., fixing of the substrate with the aid of a single-sided adhesive film and a carrier frame is often chosen.

In the material-removing laser methods, substrate material is removed along the scribing frame with the aid of one or a plurality of pulsed laser beams until all the components have been separated.

Laser methods free of removal or free of kerfs are based on the initialization and guidance of a crack through the substrate. Examples of such separating methods free of removal are so-called stealth dicing (SD) and thermal laser beam separation (TLS).

In stealth dicing such as is used to separate workpieces, e.g., in EP 1 716 960 B1, a pulsed laser beam having a high pulse intensity generates a material weakening by nonlinear absorption in the workpiece, the workpiece subsequently being broken by mechanical action at the material weakening. However, separating substrates having a thickness of 200 µm or thicker requires a plurality of passes with the laser beam along the separating line. This increases the process time and thus reduces the throughput.

Furthermore, in this technique the workpiece must not absorb the laser radiation to an excessively great extent to be able to generate the nonlinear effects at a sufficient depth in the workpiece. It is therefore not possible to separate highly doped substrates because absorption of the laser radiation takes place too near to the surface.

Thermal laser beam separation involves separating the workpiece by generating a high thermal stress using a laser beam which is sufficiently absorbed by the workpiece. Separation by the thermal stress requires initiation of the fracture by a suitable material weakening on or in the workpiece. For this purpose, it is known to introduce a notch into the surface of the workpiece at the edge of the workpiece to be separated or along a separating line, by which notch the crack is then initiated during the subsequent high degree of local heating by the laser beam.

EP 1 924 392 B1 discloses a method, wherein, before the TLS step, by local material modification using a pulsed laser on the surface of the workpiece, a track of modified material is generated along the separating line, which results in a reduction of the breaking stress of the workpiece along the separating line. The track replaces the previously introduced notch and can also be formed with different depth along the separating line to compensate for a possibly varying thickness of the workpiece. However, a notch or a material modification introduced instead of the notch at the surface can reduce the quality of the edge of the separated section or component.

It could therefore be helpful to provide a method and a device to separate a flat workpiece into a plurality of sections which enable separation at high speed and a higher quality of the resulting edges of the sections compared with the previous thermal laser beam separation.

SUMMARY

We provide a method of separating a workpiece into a plurality of sections including generating one or a plurality of lines of modified material along one or a plurality of predefined separating lines in the workpiece in a first step by local material processing using a laser beam through a surface of the workpiece, which results in a reduction of breaking stress of the workpiece along the separating lines, and dividing, in a second step, the workpiece into the sections along the separating lines by thermal laser beam separation, wherein the one or the plurality of lines are generated completely or at least in portions at a distance from the surface in the workpiece.

We also provide a device that separates a workpiece into a plurality of sections including a first laser unit, with which, by local material processing using a laser beam through a surface of a workpiece, one or a plurality of lines of modified material can be generated along one or a plurality of predefined separating lines in the workpiece which result in a reduction of breaking stress of the workpiece along the separating lines, a second laser unit designed for thermal laser beam separation of the workpiece along the separating lines, and a controller for the first and second laser beam units that generate the one or the plurality of lines in the workpiece and subsequently carrying out the thermal laser beam separation, wherein the first laser unit includes a device that alters a focal position of the laser beam in the depth of the workpiece, and the controller drives the first laser unit by variation of the focal position to generate the one or the plurality of lines at a varying distance from the surface in the workpiece.

BRIEF DESCRIPTION OF THE DRAWINGS

The method and associated device are explained again in even greater detail below on the basis of examples in association with the drawings.

DETAILED DESCRIPTION

Figure 1:
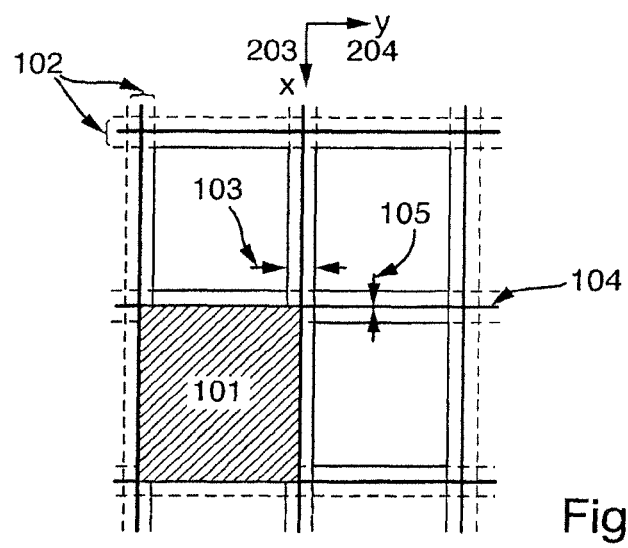
FIG. 1 shows a schematic illustration of a portion of a substrate having components in plan view.

The method is a laser-based separating method which operates in a manner free of kerfs. The method utilizes the technique of thermal laser beam separation (TLS) in which high thermal stresses are introduced into the workpiece by the combination of laser beam and cooling along the separating line, which result in the workpiece breaking along the separating line. In this case, energy and intensity of the laser radiation are chosen such that the workpiece material is not modified, in particular not melted, by the laser beam. A CW laser (CW: continuous wave) is preferably used for this purpose. The material weakening required to initiate the fracture in TLS is achieved by local material processing using a further laser beam, in particular a pulsed laser beam, through the surface of the workpiece. In this case, one or a plurality of lines of modified material are generated along the separating lines. The method is distinguished by the fact that the one or the plurality of lines are not exclusively generated along the surface, but rather extend completely or at least in portions at a distance from the surface in the workpiece. This can involve one continuous line or else a plurality of separate lines that can also be at a distance with respect to one another along the separating line. The thickness or the diameter of the lines can also vary over the length thereof.

Particularly advantageously, the respective line is generated with a course in which the line starts at the surface of the workpiece and subsequently moves away from the surface and extends at a distance from the surface in the workpiece, which distance can also vary over the length of the line. Therefore, the quality of the edge of the section or component respectively to be separated is influenced by the material modification at the surface only at the start position of the fracture. Thus, the remaining course of the component or section edges can be generated with high quality. In this case, a "high quality" should be understood to mean primarily as accurate a geometrical course of the edge as possible along the desired separating line without undulations or spalling.

By utilizing the technique of TLS, it is possible to achieve a high throughput when separating the sections. Generation of the lines of modified material responsible for initiating and guiding the fracture at least in portions at a distance with respect to the surface of the workpiece simultaneously achieves a higher quality of the edge of the separated sections or components since the line portions running at a distance with respect to the surface do not adversely influence the section or component edge. In this case, the length of the line portion or portions at a distance with respect to the surface should be as long as possible, but preferably longer than the length of the line portion or portions running on the surface.

A further advantage is that the first step of generating the line(s) can also be utilized beforehand to locally remove a metalization possibly situated on the surface of the workpiece and/or extensive PCM structures (PCM: process control monitoring) in the region of the scribing frame to enable sufficient absorption of the laser radiation in the workpiece for the later TLS or to remove security-relevant structures such as, e.g., in security RFIDs. The method thus allows both separation of workpieces having extensive PCM structures in the scribing frame and separation with the presence of thin front-side metal.

Furthermore, the method can also be used, for example, to separate substrates having relatively large substrate thicknesses, for example, having a thickness of at least 925 µm in the case of silicon substrates or having a thickness of 450 µm in the case of SiC substrates, in only one passage, i.e., with only one pass, with the laser over the respective separating line, with at the same time good rectilinearity of the separating edge. The method also enables separation of highly doped semiconductor wafers with at the same time rectilinearity of the separating edge. Stacked layers of different materials can also be separated by the proposed method. In particular, stacked substrates, e.g., silicon on glass, can be separated completely with at the same time good rectilinearity of the separating edge by the method.

The lines of modified material along the separating line generated in the first method step in the method can follow a geometrical function or else an arbitrary profile with regard to the distance from the surface. Exemplary geometrical functions are, e.g., sine function, parabola, a linear function, a sawtooth function or a triangular function. In this case, the respective distance function can also be fixedly related to the structures or dimensions of the sections to be separated, in particular dependent on the length of the section respectively to be separated.

A distance profile wherein the respective line lies at start and crossing points of the separating lines on the surface and extends between these points at a possibly varying distance with respect to the surface in the workpiece is particularly advantageous. In the same way, the line can also run along regions with a surface metalization and/or PCM structures in the scribing frame on the surface.

Two or more lines can also lie one above another along the defined separating line at a varying distance from the surface, i.e., completely or partly overlap along the separating line as viewed from the surface or in perpendicular projection onto the surface.

A variation of the distance of the lines from the surface is preferably achieved by adaptation of the focal position of the laser beam used to generate the lines in the depth direction of the workpiece, i.e., the z-value of the focal point relative to the surface of the workpiece to be separated. This variation of the focal position can be realized by various techniques. In this regard, the focal position can be implemented, e.g., with the aid of an actuator, e.g., a piezo element or a magnetic actuator, on an element that influences the relative focal position. In this regard, e.g., by a sinusoidal movement of the last converging lens of the focusing optical unit of the laser beam before the surface of the workpiece, it is possible to generate a corresponding sinusoidal distance function of the line in the workpiece. It goes without saying that the variation generated by the actuator is not restricted to such a sine function, but rather can follow an arbitrarily predefined profile or else a superimposition of arbitrary geometrical functions.

There is also the possibility of switching the laser on and off in a targeted manner during the pass of the laser beam over the workpiece to generate further shapes of the line.

A further possibility of varying the focal position in the depth direction of the workpiece consists in the use of moved optical elements or optical elements of variable focal length such as, for example, the mirror elements of variable focal length on a polygon scanner, or by the use of adaptive mirrors.

The workpiece itself can also be suitably moved relative to the laser processing head in the distance direction, or vice versa.

The lines can be generated with an energy input of the pulsed laser beam used to generate the lines, which energy input varies along the lines. This can be realized, for example, by variation of the pulse energy/laser power and/or also by variation of the pulse spacing. The variation can be effected in a manner fixedly related to the structure of the workpiece to be separated or to the sections to be separated. In this regard, in each case a higher pulse energy/laser power can be introduced and/or a smaller pulse spacing can be chosen, e.g., at the start and crossing points compared with in the intervening regions.

Figure 6:
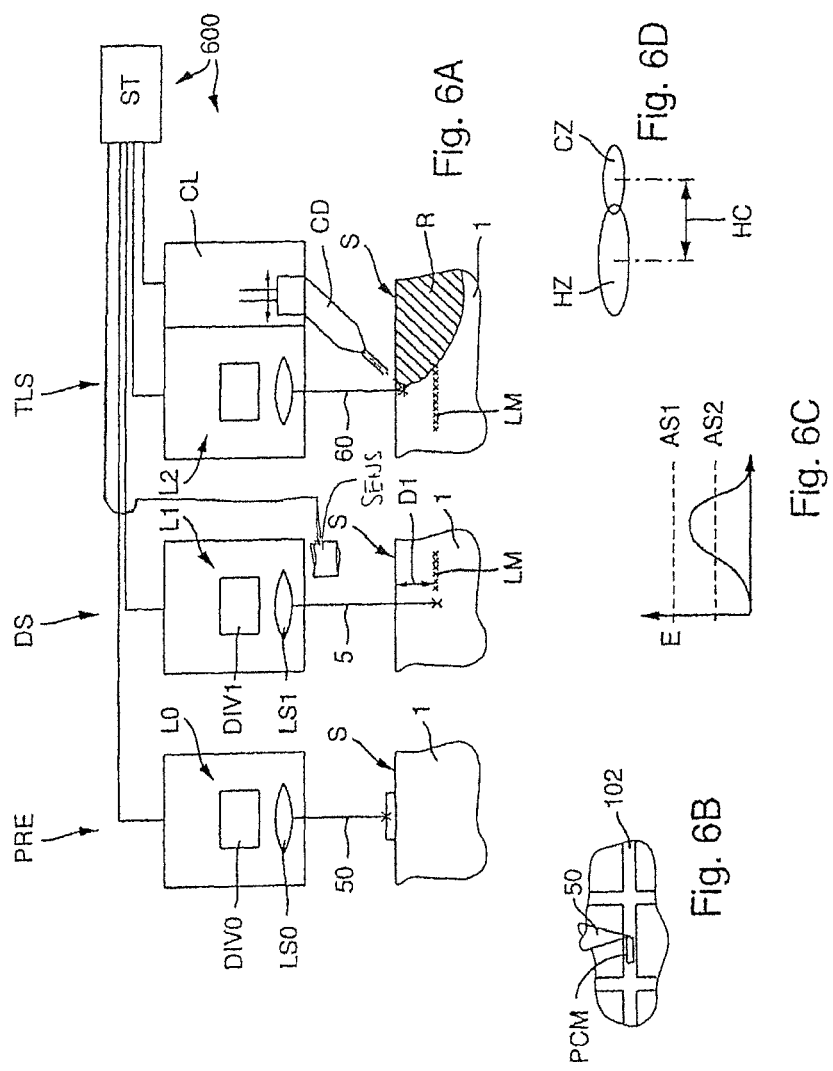
FIG. 6 shows a schematic view of one example of a device that separates flat workpieces into sections in FIG. 6A and detail views in FIGS. 6B to 6D.

For all variants of the proposed method, it is possible to use a controller for the focal position of the laser beam in the first method step with a sensor system (shown in FIG. 6 as SENS). The latter makes it possible, if necessary, to synchronize the depth position of the line, i.e., the distance of the line with respect to the surface, with the structure of the workpiece or of the sections to be separated. In this case, the sensor system identifies the relative position of the surface of the workpiece to be separated with respect to the laser focus and identifies structures possibly present on the surface such as metalization layers, for example, which must be removed near the surface with the aid of the pulsed laser radiation to enable penetration of the laser radiation for the second processing step. In this case, the controller guides the focus to the surface in each case upon detection of such structures to remove the disturbing structures.

The first step can be carried out on a substrate that has not been separately pretreated. In some method variants, however, before the first step, a pretreatment step separate from the first step is carried out, by which material situated in the region of one or a plurality of envisaged predefined separating lines on the surface of the workpiece, in particular a metalization and/or PCM structures, is/are eliminated and/or the surface is prepared for coupling in the laser beam in the first step. As a result, the efficiency and precision of subsequent steps can be improved, if appropriate.

The pretreatment step can comprise, e.g., a selective laser ablation by a pretreatment laser beam having a beam energy higher than an ablation threshold for the material situated on the surface and lower than an ablation threshold for the material of the workpiece. This can be used, e.g., to eliminate a metalization and/or PCM structures. Alternatively or additionally, the pretreatment step can comprise a smoothing of the substrate surface by local remelting by laser radiation. Rough surfaces can thereby be smoothed, e.g., such that the coupling-in of the laser beam in the subsequent first step is improved compared with coupling-in at the non-smoothed substrate.

In the first step of local laser processing, in many cases it is expedient if a line of modified material closest to the surface is generated over a predominant proportion of its length at a distance of 30 µm to 150 µm, in particular at a distance of 40 µm to 60 µm from the surface in the workpiece. If this topmost track is very near to the surface, what can usually be achieved is that the crack subsequently produced remains in the material such that the surface is not contaminated by crack residues. Moreover, the crack location can be predefined sufficiently precisely in the stress field of the later TLS step, such that the crack cannot migrate or can scarcely migrate and a precise edge course is achievable. If, in a region in which at least two of the lines are generated which lie one above another along the separating lines, a depth distance between the lines is at least 200 µm, even relatively thick substrates can be predamaged with just a few lines so precisely that the later crack plane remains accurately defined. Preferably, in such a case, first, a line lying further away from the surface is produced and, afterward, a line nearer the surface is produced such that the laser beam is always coupled in through undamaged material.

To separate the substrate, preferably, in the second step of thermal laser separation, a second laser beam that generates a heating zone is directed onto the workpiece and, near the heating zone or partly overlapping the heating zone, a cooling medium is applied to the surface to generate a cooling zone. In this case, it has proved to be advantageous if a distance between a center of the heating zone and a center of the cooling zone along the separating line is set depending on at least one workpiece parameter and/or on a separating rate. It is thereby possible to foster an improvement of the crack geometry.

In some method variants, in the second step, a focusing of the second laser beam is set such that a focus position is at a distance with respect to the surface in the interior of the workpiece. The heat can then heat the region to be heated from the inner area outward. This enables a deeper heating than in the case of a focusing of the heating beam on the substrate surface, particularly in the case of materials whose absorption coefficient is greatly dependent on temperature. The deep heating in conjunction with the cooling fosters intense and well-localized stress fields which foster a precise crack propagation. Expedient distances with respect to the surface can be, e.g., 50 µm to 500 µm, in particular 100 µm to 400 µm.

This focusing of a laser beam suitable for heating without melting in the interior of the workpiece is regarded as an independent useful aspect for all TLS methods including those in which the separating line was produced in the preceding step at the surface.

The device that carries out the method accordingly comprises a first laser unit by which the one or the plurality of lines of modified material can be generated in the workpiece, a second laser unit designed for the thermal laser beam separation of the workpiece along the separating lines, and a controller that drives the first and second laser beam units that carry out the method. In this case, the first laser unit alters the focal position of the laser beam in the depth of the workpiece (z-direction). The controller drives the first laser unit or altering device for the focal position by variation of the focal position to generate the one or the plurality of lines at a varying distance from the surface in the workpiece.

In one configuration, the device also comprises a cooling unit with which a cooling medium can be locally applied to the surface of the workpiece during the thermal laser beam separation along the separating lines. By way of example, water, a water-air mixture, air, $CO_2$ or $N_2$ can be used as a cooling medium and can be directed onto the surface of the workpiece by a spray nozzle, in combination with the laser beam, to bring about the mechanical stresses required for the separation in the workpiece. Other cooling media can also be used.

In this case, the controller can have various operating modes to drive the first laser unit to generate different courses of the separating lines in accordance with the different configurations of the proposed method.

The method and the device can be used to separate flat brittle workpieces in a wide variety of technical fields, particularly for separating components produced on thin substrates or wafers. In this regard, in the area of microelectronics or nanoelectronics, it is possible to separate semiconductor wafers of different compositions with regard to the substrate material and layer stacks to be separated. All substrates which can also be processed by the known methods are appropriate here. These are, e.g., mono- and multicrystalline semiconductors, compound semiconductors, amorphous semiconductors for use in photovoltaics, inter alia. Systems comprising combined electrical, mechanical, chemical and/or biological constituent parts, e.g., microelectromechanical systems (MEMS) or nanoelectromechanical systems (NEMS), can also be processed in accordance with the method. In the glass industry, the method can be used, e.g., in the production of displays, tiles and the like. The method and the device are not restricted to the above applications presented by way of example.

FIG. 1 shows in plan view an excerpt from a substrate 1 having chips 101 to be separated as components to clarify the terms occurring here. The scribing frame 102, the scribing frame width 103, the kerf 104, the kerf width 105 and the movement directions 203, 204 (x- and y-direction) when carrying out the separating steps are also indicated in addition to the chips 101.

Figure 2:
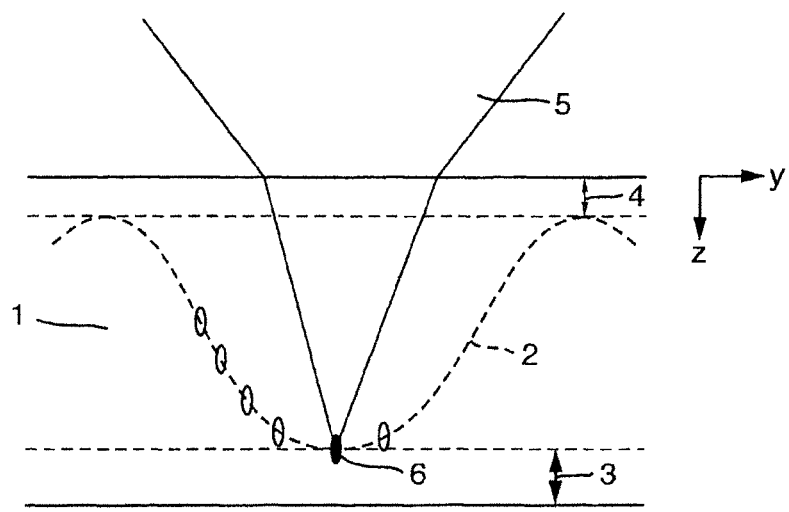
FIG. 2 is a schematic cross-sectional illustration of a portion of a substrate in which a sinusoidal line is generated in accordance with the method.

FIG. 2 shows a cross section through a corresponding substrate 1 intended to be singulated into individual sections or components. In this case, the proposed method uses two separate processing steps. In the first step, one or a plurality of lines 2 of modified material are generated along the defined separating line for localizing the TLS crack start and for guiding the TLS crack by suitable focusing of a pulsed laser beam 5 onto and/or into the substrate 1 to be separated. In the example in FIG. 2, the line 2 of modified material that is generated by the laser beam 5 has a sinusoidally varying distance from the surface of the substrate 1 and also a corresponding distance from the rear side. A minimum distance 4 with respect to the surface and also a minimum distance 3 with respect to the rear side of the substrate 1 are complied with in this example. Variation of the distance is generated by alteration of the depth position of the focus 6 of the laser beam 5 in the substrate 1. The minimum distances 3, 4 can also become zero such that the line 2 can also run in portions on the surface and/or rear side of the substrate 1. A course on the surface is preferably generated only at specific locations, e.g., to initiate the crack or at crossing points of separating lines so that the quality of the component edges of the separated components is not adversely affected by this material modification.

Figure 3:
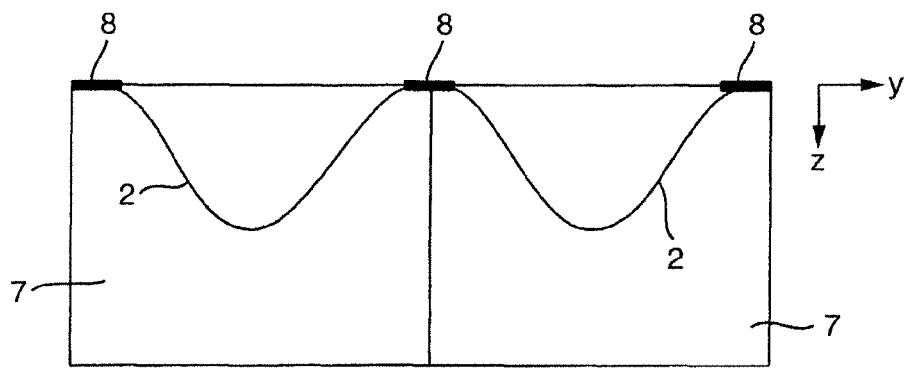
FIG. 3 shows a schematic cross-sectional illustration through two exemplary components or sections with a line of modified material generated in accordance with the method.

FIG. 3 shows an example in which the distance function of the generated line 2 from the surface runs periodically and is adapted to the dimensions of the components 7 to be separated. In this case, FIG. 3 shows a cross section through two exemplary components 7 of a substrate. In this case, the course of the line 2 is chosen such that the line 2 lies on the surface at the respective edges or marginal zones of the components 7, while it extends into the depth therebetween. These start and end points 8 of the respective line for localizing and guiding the TLS crack during the singulation of the components 7 are thus chosen on the surface here.

Figure 4:
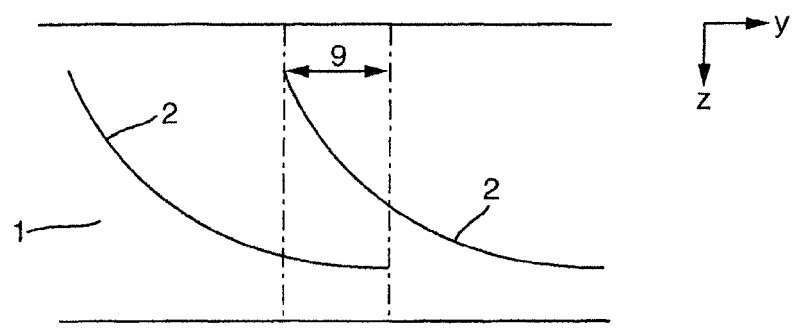
FIG. 4 shows a schematic cross-sectional illustration of a portion of a substrate in which a plurality of line segments (two thereof in the example) of modified material were generated in accordance with the method.

Finally, FIG. 4 shows a further example of a possible course of the lines 2 in the substrate 1. In this configuration, two lines 2 succeeding one another along the separating line are generated in that portion of the substrate 1 which is illustrated in cross section, the lines 2 overlapping by a specific value in a region 9. The overlap is realized by the different distances of the two lines 2, curved in this example, from the surface in the overlapping region 9.

Figure 5:
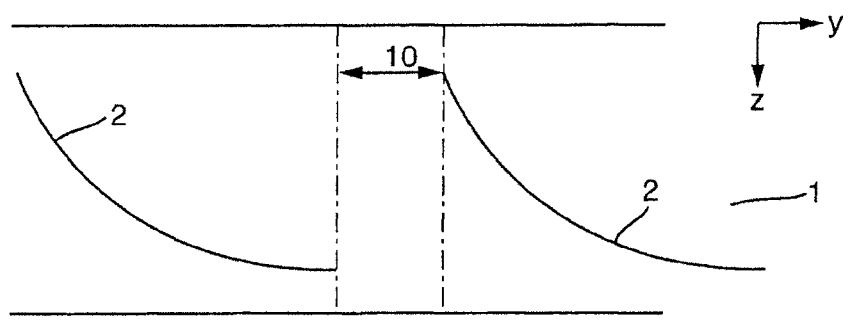
FIG. 5 shows a further schematic cross-sectional illustration of a portion of a substrate in which a plurality of line segments (two thereof in the example) of modified material were generated in accordance with the method.

Finally, FIG. 5 shows a further example of a variant of lines 2, curved in this example, which in this case do not overlap, but rather are at a corresponding distance 10 from one another in the direction of the respective separating line.

The geometrical course of the lines 2, a possible overlap or a possible distance are chosen depending on the requirements and the desired result of the separation of the components depending on the workpiece material and the workpiece thickness. After introduction of the corresponding line(s) in the first step, the TLS process is carried out in the second step to completely separate the substrate (cleave step). This is carried out by thermally induced mechanical stresses introduced by a combination of a further laser and a cooling along the separating line.

In this regard, by way of example, to separate a silicon substrate having a thickness of 400 µm into individual chips, a pulsed Nd:YAG laser having an average power of 1.2 W can be used to generate the lines in the first step. A Yb:YAG CW laser having a cw laser power of 130 W and a feed rate of 250 mm/s can then be used for the subsequent TLS step.

For further explanation of variants of the method and of the device, FIG. 6 shows a schematic view of a device 600 that separates a flat workpiece 1 into a plurality of sections in FIG. 6A. The device is constructed in the manner of a production line and comprises a plurality of processing units which are to be passed through successively by the workpiece and in which in each case temporally successively different processing steps are carried out on the workpiece.

A pretreatment unit PRE is configured to carry out, before the abovementioned first step (to generate lines of modified material), at least one pretreatment step by which material situated on the surface of the workpiece in the region of one or a plurality of envisaged predefined separating lines in the regions of the scribing frames such as a metalization and/or PCM structures, for example, can be eliminated and/or, if appropriate, the surface can also be prepared to couple in the laser beam in the subsequent first step. The pretreatment can comprise, e.g., a smoothing of the substrate surface by local remelting, which is also referred to here as "laser polishing."

After the pretreatment step, the workpiece is transported to the downstream first laser processing unit DS in which the first step of generating the at least one line LM of modified material is carried out. Since the line is generated at least partly at a distance below the surface S of the workpiece 1 at a certain depth within the material, the unit is also referred to as a deep scribe unit (abbreviated to DS). The unit contains the first laser unit L1, with which one or a plurality of lines LM of modified material can be generated along one or a plurality of predefined separating lines in the workpiece by local material processing by the laser beam 5 through the surface S of the workpiece 1. The laser processing is effected here such that the lines of modified material bring about a reduction of the breaking stress of the workpiece along the separating lines.

The workpiece is subsequently transported to the downstream unit configured for thermal laser beam separation and is also referred to here as TLS unit TLS. The TLS unit comprises a second laser unit L2 designed for thermal laser beam separation of the workpiece along the separating lines, and also a cooling unit CL, by which a cooling medium can be locally applied to the surface of the workpiece during thermal laser beam separation along the separating lines, with the result that thermally induced mechanical stresses build up in the workpiece on account of the temperature differences, the mechanical stresses resulting in the precise crack of the workpiece material along the predefined separating lines. Each of the units connects to a controller ST, which controls the individual method steps in accordance with the stipulation of the process.

The laser unit L0 of the pretreatment unit PRE is designed such that a selective laser ablation of materials situated on the surface S of the workpiece in the region of the scribing frames 102 such as PCM structures PCM and/or a metalization, for example, takes place by the laser beam 50. A divergence modifier DIV0 and a downstream converging lens LS0 are configured in this case such that the laser beam 50 is focused onto the structures to be eliminated on the surface (FIG. 6B). The beam properties of the laser beam are set such that the ablation threshold AS2 for the material to be eliminated that is situated on the surface is significantly exceeded, while the ablation threshold AS1 for the material of the workpiece 1 is significantly undershot (FIG. 6C). As a result, practically no material removal takes place on the workpiece material, while the irradiated material of the structures situated on the surface is evaporated or eliminated in some other way.

By the pretreatment unit PRE, the scribing frame 102, i.e., the region between the desired structures on the sections 101, or at least one defined part of the scribing frames can be cleaned. Possibly, the surface can also be modified to promote better coupling-in of the laser in the subsequent first step. A short-pulse laser, in particular a nanosecond laser, picosecond laser or femtosecond laser, is preferably used as pretreatment laser. The laser wavelength is preferably chosen such that the laser radiation is practically not absorbed in the workpiece material, but there is high absorption in the material of the overlying layers or structures.

Alternatively or additionally, local remelting of the substrate material can be effected, e.g., by a laser having pulse lengths, e.g., in the range of from a few ns to a few ms. This pretreatment process, which is also referred to here as "laser polishing," may be advantageous, e.g., in very rough surfaces at which coupling-in of the laser beam in the downstream DS station, i.e., when generating the lines of modified material, is disturbed on account of the high surface roughness since the laser light is excessively diffusely scattered. A smoothing by remelting can reduce the short-frequency roughnesses and thus enables better coupling-in and/or reduced diffuse scattering. Typical remelting depths can in some cases be a few µm, e.g., up to 5 µm, but possibly also significantly greater, for example, up to several hundred micrometers, e.g., 200 µm.

The deep scribe unit DS comprising the first laser unit L1 arranged downstream of the pretreatment unit in the direction of the material flow generates the lines LM of modified material. In this case, the laser beam has to be focused such that the lines run over long regions of greater or lesser extent at a distance below the surface S within the material of the workpiece 1 at a predefined depth. To achieve coupling-in and focusing at the desired depth, a device altering the focal position of the laser beam 5 in the depth of the workpiece is provided. In the case of the example, the device comprises a variably settable divergence modifier DIV1 and a downstream converging lens L1. The converging lens is stationary, that is to say need not be moved. The variable divergence modifier DIV1 is configured to vary the divergence of the beam emerging in the direction of the converging lens L1 in accordance with control signals of the controller ST. In this case, an increase in the divergence results in a deeper focal position compared to smaller divergence angles or parallel incidence of radiation. Other methods of altering the focal position described herein are likewise possible.

In some method variants, this partial process is controlled such that the line LM of modified material, that is to say a damage track for crack guidance, arises approximately in the upper third of the workpiece (as viewed from the surface S), in particular in a depth range corresponding to a distance D1 of 30 µm to 150 µm from the surface S. If the distance D1 with respect to the surface S is 40 to 60 µm, for example, it can generally be ensured that in the deep scribe step the crack remains within the material and does not escape upwardly to the surface. On the other hand, the depth is small enough to ensure that during subsequent thermal laser separation the crack arises at the correct location within the thermal stress field of thermal laser separation and remains there.

In the method variants described with reference to FIG. 6, under certain circumstances many lines LM of modified material are applied onto and/or into the substrate, the lines inevitably also crossing one another in the region of crossing points as viewed from above (cf. FIG. 1). Since crossing points can potentially sustain more damage since processing or irradiation by a laser takes place at least twice there, in some variants provision is made for predefining the depth position of the lines such that the lines in one direction and in the other direction running transverse with respect thereto are situated at different depths in the region of the crossing points.

After lines of modified material or regions having a reduced breaking stress of the workpiece material have been generated with the aid of the first laser unit L1, the second step, namely the separation of the workpiece along separating lines by thermal laser beam separation, is carried out after the workpiece has been transported to the TLS unit TLS. The second laser unit L2 uses for this purpose a laser beam 60 whose wavelength, energy and intensity are chosen such that the workpiece material is not modified, in particular not melted, by the laser beam, rather only a localized heating of the workpiece material takes place in a heating zone HZ (FIG. 6D, view of the workpiece surface from above). At the same time, the workpiece material in the region near the surface is locally cooled in the region of a cooling zone CZ with the aid of the cooling unit CL. For this purpose, the cooling unit has a coolant nozzle CD that can be used to spray or blow a fluid cooling medium onto the workpiece surface S. By way of example, a mixture of cooling gas (for example, air) and water droplets can be used as coolant.

The high, thermally induced stresses particularly at the transition from the heating zone to the cooling zone result in a crack R running with high precision largely in a crack plane perpendicular to the surface and propagates in a controlled manner at the feed rate of the workpiece during thermal laser separation.

One special feature of the TLS unit TLS is that the distance HC between the center of the heating zone and the center of the cooling zone can be adjusted in a continuously variable manner, e.g., in a distance range of approximately 1 mm to 5 mm, if appropriate also above or below that. This is realized, for example, by virtue of the fact that the coolant nozzle CD can be linearly displaced relative to the laser unit L2 and locked at different positions by a setting unit. As a result, the properties of the thermal stress field can be optimally adapted to process parameters of the separating process such as, for example, feed rate of the workpiece, workpiece material or the like.

Figure 7:
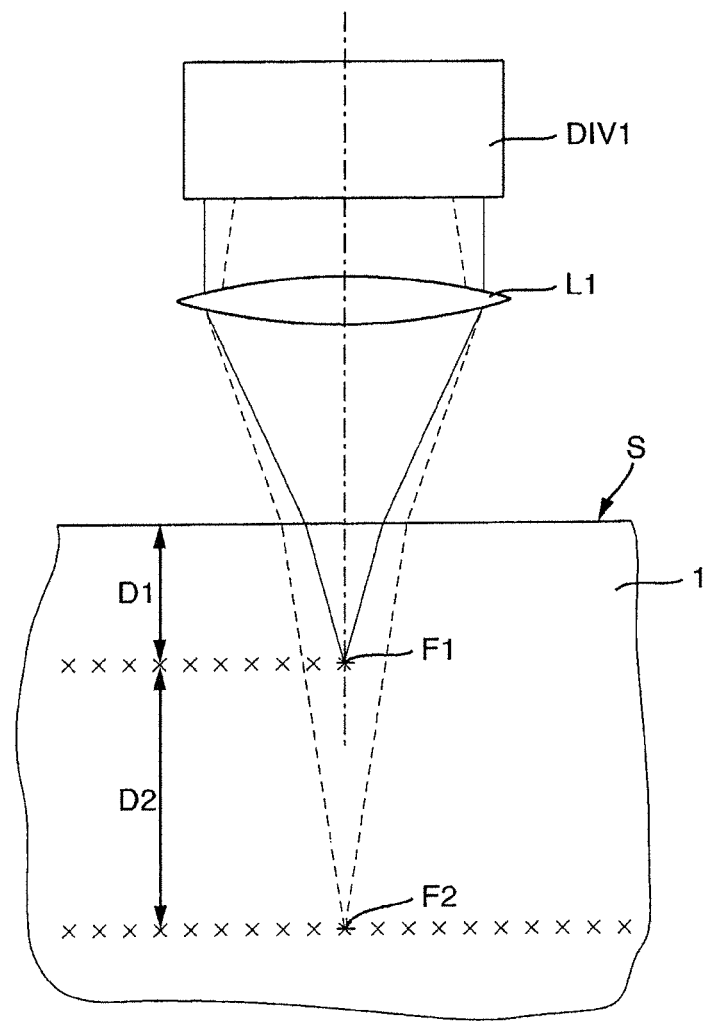
FIG. 7 shows a schematic view of processing of generating lines of modified material that lie one above another.

Further variants of the first step, namely generating modified lines, within the workpiece material, will be explained with reference to FIG. 7. The illustration shows the last converging lens L1, fitted in a stationary fashion, and the divergence modifier DIV1 disposed upstream thereof, which enables the beam divergence to be set in a continuously variable manner. In the case of the example, in a workpiece 1 having a thickness of more than 400 µm, a plurality of lines of modified material are intended to be generated vertically one above another along a separating line to accurately define the course of the separating plane perpendicular to the surface S during later thermal laser separation. In a first operating mode, the first laser beam unit is set such that the laser beam is focused through the surface S into a plane at a first focus F1, which lies at a distance D1 of 40 to 60 µm, for example, below the surface to generate a first line LM1 of modified material. The latter runs over the majority of its length approximately parallel to the surface S and can run as far as the surface in marginal zones. In this case, marginal zones can also be regions which become a marginal zone of a section only later as a result of the separation in an orthogonal direction.

In a second operating mode, the same region of the scribing frame is traversed a second time along the desired separating line, wherein the beam emerging from the divergence modifier DIV1 is set with higher divergence such that the plane of the second focus F2 of the laser beam is then situated at a greater depth within the material, specifically at a depth distance D2 from the first line LM1. We found that vertical distances D2 of the order of magnitude of 200 µm or more ensure that during subsequent thermal laser separation the crack runs largely exactly in the desired separating plane along the separating line. Use is made here of one advantage of thermal laser separation, in that the highly localized stress fields in the material foster crack progress substantially perpendicular to the workpiece surface such that relatively large distances between damage lines suffice to predefine the desired separating plane.

In some variants, first, the deeper line LM2 is generated and, afterward, the line LM1 nearer to the surface is generated. On thicker substrates, it is also possible to generate three or more than three lines lying one above another in the depth.

As an alternative to pictorially illustrated apportionment and successive performance of pretreatment step (PRE), generation of lines of modified material (first laser processing step (deep scribe) by first laser processing unit DS) and subsequent thermal laser separation (TLS) for the entire substrate in each case, other method implementations and system configurations are also possible. By way of example, the modules for the pretreatment step (PRE), the generation of lines of modified material (DS) and the thermal laser separation can be disposed one directly after another such that these steps are performed one after another in each case along a separating line before the next separating line parallel thereto or perpendicular thereto is processed. It possible to combine the modules in a combination module such that for each dicing step (separating step) all of the operations are performed one directly after another in each case. It is also possible to do this only with individual modules, by combining, e.g., only the pretreatment unit (PRE) and the unit DS that generates the lines of modified material to form a combination module. A laser source can be saved here, under certain circumstances, by the laser beam that emerges from a common laser source being split by a beam splitter unit into a first partial beam for the pretreatment of the surface and a second partial beam that generates the lines of modified material. Beam splitting can also be provided within an individual module to generate two or more partial beams, e.g., during the pretreatment and/or during the first laser processing step, the partial beams processing the substrate synchronously along separating lines parallel to one another.

In view of the fact that the step of thermal laser separation in many cases has to be carried out more slowly or at a lower feed rate than the preceding steps, in particular the first laser processing step, provision can be made for disposing downstream of a first laser processing unit two or more second laser processing units and cooling units that can be operated temporally in parallel, and for distributing the substrates along the downstream TLS stations by a distribution unit after the conclusion of the first laser processing step.

Figure 8:
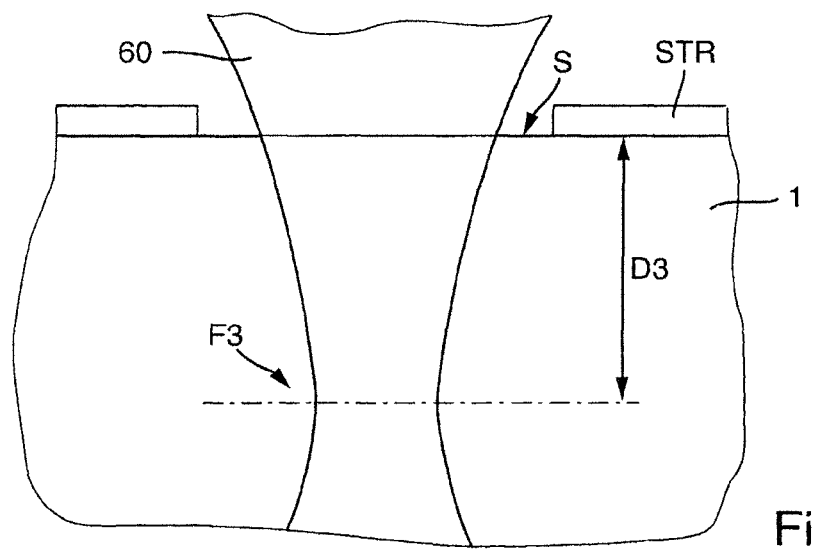
FIG. 8 shows focusing of the second laser beam in the interior of the workpiece for the purpose of heating during thermal laser separation.
Figure 9:
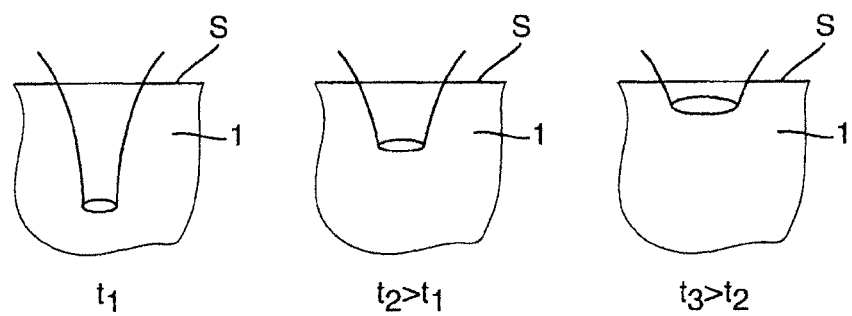
FIG. 9 shows detail views of second laser processing for the purpose of heating the workpiece during thermal laser separation at successive points in time.

Special features in the laser beam-based heating during thermal laser separation, that is to say in the second step, will be explained with reference to FIGS. 8 and 9. It is possible to focus the second laser beam unit for heating such that the focal region of the laser beam is situated on or in proximity to the surface S of the workpiece. Investigations have shown, however, that it may be advantageous to position the focal region F3 within the material, i.e., at a vertical distance with respect to the surface S of the workpiece 1. Distances D3 between the focal position and the surface can vary in a material-dependent manner and be 100 µm to 500 µm, for example. In addition, the wavelength of the second laser beam should be chosen in a manner adapted to the material of the workpiece such that sufficient absorption occurs in the material such that the material is heated. For the processing of silicon, e.g., wavelengths around 1070 nm have proved to be particularly suitable. In general, it appears to be expedient to choose, for heating semiconductor materials, laser wavelengths whose energy is somewhat lower than the band gap of the respective material. The second laser beam 60 is preferably focused such that the area of intersection between the laser beam and the surface S lies completely within the scribing frame with a lateral safety distance with respect to the adjacent structures STR of the sections such that the latter are not impinged on by the laser beam.

If the region of highest energy density, i.e., the focal region, is transferred to within the workpiece material, what can be achieved is that the heated zone reaches down to greater depths than in focusing at the surface. What can be achieved as a result is that the thermally induced stress field striven for also extends within the material to greater depths than in focusing at the surface. This in turn makes it possible to control the course of the crack plane (ideally perpendicular to the surface) better than in heating only near the surface.

Focusing the laser beam within the workpiece in the second step makes it possible to generate the desired heating from the interior of the workpiece in the direction of the surface. The heating in deeper zones at a greater distance from the surface, with focusing within the workpiece material, is also possible for such workpieces whose workpiece material has a greatly temperature-dependent absorption coefficient for the laser beam in the second step. In this case, the penetration depth of the laser beam changes with increasing temperature or increasing irradiation duration. In this respect, FIG. 9 schematically shows a portion of the workpiece at different times during irradiation to heat the workpiece material. At the point in time $t_1$ at the beginning of the heating phase, the greatest proportion of heat arises in the region of the focus situated within the material at a large distance from the surface. With increasing heating, absorption of the workpiece material increases such that the penetration depth of the laser beam is already reduced at a later point in time $t_2 > t_1$. At an even later point in time $t_3 > t_2$, the laser beam can barely still penetrate into the material, on account of the absorption that has increased again. What can be achieved in this way is that even without machine-based adjustment of the focal position the workpiece is heated in the envisaged separating region down to greater depths sufficiently to generate a stress field extending down into the depth of the material. Circular and also elliptic, square or non-square elongate rectangular beam cross sections can be used for this purpose.

This example can be advantageous in other methods of thermal laser separation as well, independently of the other features of the methods and devices described herein, and is regarded as non-limiting. In particular, this procedure during heating can also be used if, in the preceding first step, the lines of damaged material were generated only along the surface of the workpiece.

In a subsequent cleaning step, not illustrated in more specific detail, the processed workpiece with the sections now separated from one another can be cleaned in a cleaning operation. For this purpose, by way of example, the surface can be blown free by compressed air or some other compressed gas to eliminate possible residues. It is also possible to rapidly rotate the workpiece as a whole to clean the surface using centrifugal forces. These measures can be combined.

The proposed method has numerous advantages over the known methods of stealth dicing (SD) and hitherto known thermal laser beam separation (TLS), with a scribing edge or line along the surface of the workpiece, as can be gathered from the following table:

| # | Feature | Proposed method | SD | TLS |
|---|---|---|---|---|
| 1 | Ablation-free separation of thin rear-side metal | yes | no | yes |
| 2 | Separation of extensive PCM structures in the scribing frame | yes | no | limited |
| 3 | Separation of thin front-side metal | yes | no | no |
| 4 | Combined "single-pass process" for substrate thicknesses up to 925 μm (Si) or 450 μm (SiC) | yes | no | yes |
| 5 | Separation of highly doped wafers | yes | no | yes |
| 6 | Rectilinearity of the separating card | good | good | not as good |
| 7 | Quality of the side surface | Modification a few μm, independent of substrate thickness, remainder smooth | Modification approximately 50% of the Substrate thickness, remainder smooth | |
| 8 | Dependence of the scribing frame width on the wafer thickness | low | high | low |
| 9 | Selective separation of stacked substrates | good and straight | no | good, less straight |
| 10 | Complete separation of stacked substrates | good and straight | no | good, less straight |
| 11 | Separation of vibration- and/or shock-sensitive components, e.g., MEMS | yes | limited | Limited |

The invention claimed is:

1. A method of separating a workpiece into a plurality of sections, the method comprising:
generating one or a plurality of lines of modified material along one or a plurality of predefined separating lines in the workpiece in a first step by local material processing using a first laser beam through a surface of the workpiece such that the first laser beam generates a reduction of breaking stress of the workpiece along the one or a plurality of predefined separating lines, and
dividing, in a second step, the workpiece into the sections along the one or a plurality of predefined separating lines by thermal laser beam separation by directing a second laser beam that generates a heating zone onto the workpiece and, near the heating zone or partly overlapping the heating zone, applying a cooling medium to the surface to generate a cooling zone,
wherein the generating the one or the plurality of lines of modified material generates the one or the plurality of lines of modified material 1) in portions at a distance from the surface in the workpiece, and 2) such that each one of the one or the plurality of lines of modified material start at the surface of the workpiece and then extend at varying distances with respect to the surface along the one or a plurality of predefined separating lines in the workpiece, and guiding the one or the plurality of lines of modified material in a region of surface structures or a surface metalization on the one or a plurality of predefined separating lines which would obstruct a coupling of laser radiation for the thermal laser beam separation into the workpiece to the surface to locally remove said surface structures or said surface metalization on the one or a plurality of predefined separating lines using the first laser beam.

2. The method as claimed in claim 1, wherein the one or the plurality of lines of modified material start at a marginal position of each section at the surface and then extend at a varying distance with respect to the surface along the one or a plurality of predefined separating lines in the workpiece.

3. The method as claimed in claim 1, wherein the one or the plurality of lines of modified material start at a first marginal position of each section at the surface, then extend at a varying distance with respect to the surface along the one or a plurality of predefined separating lines in the workpiece and reach the surface again at a second marginal position situated opposite the first marginal position on the section.

4. The method as claimed in claim 1, wherein generating the one or the plurality of lines of modified material comprises generating lines of molten material or amorphized material or material removed at the surface.

5. The method as claimed in claim 1, wherein the one or a plurality of lines of modified material comprise at least two lines of modified material, the at least two of the lines of modified material lie partly one above another along the one or a plurality of predefined separating lines.

6. The method as claimed in claim 1, wherein generating the one or the plurality of lines of modified material comprises varying energy input of the laser beam.

7. The method as claimed in claim 1, wherein generating the one or the plurality of lines of modified material utilizes a pulsed laser beam.

8. The method as claimed in claim 1, wherein the distance of the one or the plurality of lines of modified material from the surface of the workpiece is varied by generating variation of a focal position of the laser beam in the thickness direction of the workpiece.

9. The method as claimed in claim 1, wherein the one or a plurality of lines of modified material comprise at least two lines, and the line closer or closest to the surface extends over more than half its length at a distance of 30 μm to 150 μm from the surface in the workpiece.

10. The method as claimed in claim 1, wherein, in a region in which at least two of the lines are generated which lie one above another along the separating lines, a depth distance between the lines is at least 200 μm, or in that, in a region in which the one or a plurality of lines of modified material comprise at least two lines of modified material, a first line of the at least two lines of modified material lying further from the surface than a second line of the at least two lines of modified material, wherein both the first and second line lie along one of the one or a plurality of separating lines, wherein the step of generating the one or a plurality of lines of modified material further comprises first generating the first line, and afterward, generating the second line.

11. The method as claimed, in claim 1, further comprising setting a distance between a center of the heating zone and a center of the cooling zone along the separating line depending on at least one workpiece parameter or on a separating rate.

12. The method as claimed in claim 1, further comprising, in the second step, setting a focusing of the second laser beam such that a focus position is in the interior of the workpiece.

13. The method as claimed in claim 12, wherein the distance is 50 μm to 500 μm.

14. A device that separates a workpiece into a plurality of sections, the device comprising:

a first laser unit, with which, by local material processing using a laser beam through a surface of a workpiece, one or a plurality of lines of modified material can be generated along one or a plurality of predefined separating lines in the workpiece which result in a reduction of breaking stress of the workpiece along the separating lines, and such that they start at the surface of the workpiece and then extend at a varying distance with respect to the surface along the separating line in the workpiece, a second laser unit configured to perform thermal laser beam separation of the workpiece along the one or a plurality of predefined separating lines, a controller for the first and second laser units, and a cooling unit driven by the controller and with which a cooling medium can be locally applied to the surface of the workpiece during the thermal laser beam separation along the separating lines, wherein a focal position of the laser beam of the first laser unit in the depth of the workpiece is adjustable, and the controller 1) drives the first laser unit by variation of the focal position to generate each one of the one or the plurality of lines of modified material at varying distances from the surface in the workpiece, and 2) controls the focal position of the laser beam during generation of the one or the plurality of lines of modified material such that surface structures or a surface metallization on the one or a plurality of predefined separating lines are removed by the laser beam.

15. The device as claimed in claim 14, wherein the first laser unit comprises a pulsed laser and the second laser unit comprises a continuous wave laser.

16. The device as claimed in claim 14, wherein the controller has an operating mode in which it drives the first laser unit that generates the one or the plurality of lines of modified material such that the one or a plurality of predefined separating lines start at a marginal position (predefined for the controller) of each section at the surface and then extend at a varying distance with respect to the surface along the one or a plurality of predefined separating lines in the workpiece.

17. The device as claimed in claim 14, wherein the controller has an operating mode in which it drives the first laser unit that generates the one or the plurality of lines of modified material such that the one or a plurality of predefined separating lines start at a first marginal position (predefined for the controller) of each section at the surface, then extend at a varying distance with respect to the surface along the one or a plurality of predefined separating lines in the workpiece, and reach the surface again at a second marginal position (predefined for the controller) situated opposite the first marginal position on the section.

18. The device as claimed in claim 14, wherein the controller drives the first laser unit that generates the one or the plurality of lines of modified material with varying energy input of the laser beam.

19. The device as claimed in claim 14, wherein the controller connects to a sensor system that identifies structures present on the surface of the workpiece in the region of the separating lines.

20. The device as claimed in claim 14, further comprising a pretreatment unit with a laser unit configured to carry out, before the first step, at least one pretreatment step by which material situated in a region of the one or a plurality of predefined separating lines on the surface of the workpiece can be eliminated or by which the surface can be prepared for coupling in the laser beam in the subsequent first step by a smoothing of the substrate surface by local remelting.

* * * * *